United States Patent [19]
Tanaka et al.

[11] Patent Number: 5,541,412
[45] Date of Patent: Jul. 30, 1996

[54] TWO DIMENSIONAL ARRAY INFRARED RAY IMAGE PICKUP DEVICE

[75] Inventors: Akio Tanaka; Nobukazu Teranishi, both of Tokyo, Japan

[73] Assignee: NEC Corporation, Tokyo, Japan

[21] Appl. No.: 348,112

[22] Filed: Nov. 25, 1994

[30] Foreign Application Priority Data

Nov. 24, 1993 [JP] Japan .................................. 5-293256

[51] Int. Cl.$^6$ ............................... H01L 31/00; G01J 5/08
[52] U.S. Cl. ..................... 250/332; 250/330; 250/338.4; 250/370.08; 250/338.1
[58] Field of Search ............................... 250/330, 332, 250/338.4, 370.08, 338.1, 339.02, 339.04

[56] References Cited

U.S. PATENT DOCUMENTS

| | | | |
|---|---|---|---|
| 5,049,752 | 9/1991 | Kalaf et al. | 250/370.08 |
| 5,286,976 | 2/1994 | Cole | 250/338.4 |
| 5,293,036 | 3/1994 | Norton | 250/232 |
| 5,300,915 | 4/1994 | Higashi et al. | 250/338.4 |
| 5,306,915 | 4/1994 | Matthews | 250/332 |
| 5,308,980 | 5/1994 | Barton | 250/332 |
| 5,401,968 | 3/1995 | Cox | 250/332 |

Primary Examiner—Constantine Hannaher
Assistant Examiner—Virgil Orlando Tyler
Attorney, Agent, or Firm—Young & Thompson

[57] ABSTRACT

An infrared ray image pickup device has a two-dimensional array structure having a sensor substrate, a plurality of scanning circuits provided to form two dimensional arrays on a surface of the substrate, a layer having a plurality of cavities provided over the scanning circuits, a plurality of beams provided to extend over the cavities, each of the beams including an element for converting a temperature variation to an electric signal, a supporting element provided on a peripheral region of the substrate for supporting a lens substrate including a plurality of micro-lenses that are located to face the beams so that a convex portion of each of the micro-lenses is spaced from a top of each of the beams by the same distance as a focal distance of the micro-lenses. The supporting element may have a plurality of convex portions made of boron phosphate silicate glass or boron silicate glass. Alternatively, the supporting element may include a plurality of bearings provided on a packaging substrate and bonding agents surrounding the bearings, the packaging substrate being provided thereon with the sensor substrate.

4 Claims, 5 Drawing Sheets

TWO DIMENSIONAL ARRAY INFRARED RAY IMAGE PICKUP DEVICE

BACKGROUND OF THE INVENTION

1. Field of the Invention

The invention relates to an infrared ray image pickup device, and more particularly to an improvement of a thermal infrared ray image pickup device having thermoelectric transducers that convert heat to an electric signal and two dimensional arrays of pixels.

2. Description of the Related Art

The infrared ray image pickup devices have been widely used in the fields of crime prevention, observation, guidance, medical treatment and industrial measurements and others. A requirement for a real time image pickup of temperature distributions of objects or articles has been on the increase. Under these circumstances, a requirement for an improvement of the two-dimensional array infrared ray image pickup devices in view of a reduction of a cost thereof has also been on the increase.

Various types of infrared ray image pickup devices have been known. A first conventional type infrared ray image pickup device has a two story structure wherein the first story includes a scanning circuit for scanning signals for each pixel involved in the infrared ray image pickup device and the second story includes thermoelectric transducers for converting heat to electric signals. Further noise reduction circuits are provided in each pixel.

Such a conventional infrared ray image pickup device is illustrated in FIGS. 1A and 1B. The first type conventional infrared ray image pickup device comprises two-dimensional arrays of pixels that are provided on a semiconductor substrate 19. Scanning circuits 20 are provided for each pixel on the semiconductor substrate 19. Cavities 22 are provided for each pixel on an oxide film 21 that is provided on the scanning circuits 20 so that the scanning circuits and the cavities 22 are separated through the oxide film 21. Diaphragms 24 are provided for each pixels over the cavities 22. The diaphragm 24 comprises a thin oxide film. Thermoelectric transducers 23 are provided for each pixel within the diaphragms 24 so that each of the thermoelectric transducer 23 is sandwiched between upper and bottom portions of each of the diaphragms 24. The thermoelectric transducer 23 comprises an element for converting heat to electric signals, for example, a thermocouple. In each pixel, the thermoelectric transducer 23 is electrically connected through a metal wire 25 made of aluminum to the scanning circuit 20.

An incidence of infrared rays on the top surface of the diaphragm 24 causes a variation in temperature of the top portion of the diaphragm 24 so that the thermoelectric transducer 23 senses the temperature variation to convert it to electric signals that are subsequently transferred to the scanning circuit 20 through the metal wiring 25. The scanning circuit 20 receives the electric signals to integrates the received electric signals for noise reduction. Further, the scanning circuit 20 conducts the scanning of the electric signals for each pixel for subsequent transfer of the scanned signals to the exterior of the device. The above conventional infrared ray image pickup device is disclosed in the Japanese Patent Application No. 5-183116.

The first type of the conventional infrared ray image pickup device has a problem with the diaphragm 24 that may permit a heat caused by the infrared ray incidence on the surface of the diaphragm to be prevented by a thermal conduction through the diaphragm. This may restrict an improvement in a sensitivity of the infrared ray image pickup device. As a modification, removal of a part of the diaphragm to prevent the thermal conduction may result in a reduction of an infrared ray receiving area in the infrared ray image pickup device. The reduction of the infrared ray receiving area may of course restrict the required improvement in the sensitivity of the infrared ray image pickup device.

A second type of the conventional infrared ray image pickup device is illustrated in FIG. 2. The second type of the conventional infrared ray image pickup device has a thermoelectric transducer 28 in the form of a beam 29 extending over a V-shaped groove formed in an upper portion of a semiconductor substrate 26. A surface of the V-shaped groove of the semiconductor substrate 26 is coated with an infrared ray reflection film 27 that serves as a converging mirror to converge the reflected infrared ray toward the beam 29 of the thermoelectric transducer 28. The structure of the thermoelectric transducer 28 in the form of the beam 29 extending over the V-shaped groove may be formed by an isotropic etching technique in forming the V-shaped groove after the thermoelectric transducer 28 is formed to overlie the surface of the semiconductor substrate 26. The above conventional infrared ray image pickup device is disclosed in the Japanese Laid-open Patent Application No. 4-132271.

The second type of conventional infrared ray image pickup device has a problem with a difficulty in forming scanning circuits on the semiconductor substrate 26 having the V-shaped groove, thereby resulting in a difficulty in obtaining a high density integration of the two dimensional arrays of the pixels.

A third type of the conventional infrared ray image pickup device is illustrated in FIG. 3. The third type of conventional infrared ray image pickup device has micro-lenses, each of which may serve as a converging lens to converge infrared rays. The micro-lenses are provided on a sensor substrate 30. The micro-lenses include cavities 33 filled with vacuum wherein the vacuum cavities 33 are positioned over the top of the sensor substrate 30. Each of the vacuum cavities 33 accommodates a thermoelectric transducer 31 that is provided on the top of the sensor substrate 30. The above conventional infrared ray image pickup device is disclosed in the Japanese Laid-open Patent Application No. 3-263001.

The third type of the conventional infrared ray image pickup device has the following two problems. The micro-lenses 32 are formed on a lens substrate. The lens substrate is required to have a thickness of at least about 100 micrometers. Such thickness of the lens substrate may cause a first problem as described below and illustrated in FIGS. 4A and 4B. Obstacle and vertical incidences of the infrared rays have a variation of a focal point on the thermoelectric transducer 31 in a lateral direction parallel to the surface of the layers. Particularly, the variation of the focal point in the lateral direction is a serious problem as the pixel size comes into the same size as the thickness of the lens substrate. An infrared ray passing through a peripheral portion of the lens comes into an obstacle incidence on the thermoelectric transducer. The infrared ray having the obstacle incidence has the focal point varied from the thermoelectric transducer in the lateral direction. Namely, the infrared ray having the obstacle incidence is irradiated on a point away from the thermoelectric transducer, for which reason the thermoelectric transducer is incapable of sensing the infrared ray of the obstacle incidence so that the thermoelectric transducer is able to sense only an infrared ray passing through the lens in the vicinity of the optical axis thereof. This results in a lowering of a sensitivity of the infrared ray image pickup device.

A second problem with the third type of the conventional infrared ray image pickup device is in a difficulty in providing a beam structure of pixels for prevention of a heat conduction. It is difficult to permit the beam structure to have a sufficient mechanical strength to support the micro lens. In a high density integration of the pixels, an alignment of the micro-lenses on the lens substrate may expose the beam structure to danger of destruction. Consequently, it is difficult to provide the beam structure to the infrared ray image pickup device for prevention of the lowering of the sensitivity thereof.

SUMMARY OF THE INVENTION

Accordingly, it is a primary object of the present invention to provide a novel infrared ray image pickup device free from any disadvantages or problems as described above.

It is a further object of the present invention to provide a novel infrared ray image pickup device having a high sensitivity.

It is a furthermore object of the present invention to provide a novel infrared ray image pickup device capable of preventing a heat conduction to keep a high sensitivity.

It is a moreover object of the present invention to provide a novel infrared ray image pickup device having a possible wide area for receiving infrared rays to keep a high sensitivity.

It is a still further object of the present invention to provide a novel infrared ray image pickup device having two dimensional arrays of pixels.

The above and other objects, features and advantages of the present invention will be apparent from the following descriptions.

The invention provides a novel infrared ray image pickup device having a two-dimensional array structure that comprises a sensor substrate, a plurality of scanning circuits provided to form two dimensional arrays on a surface of the substrate, a layer having a plurality of cavities provided over the scanning circuits, a plurality of beams provided to extend over the cavities, each of the beams including an element for converting a temperature variation to an electric signal, a supporting element being provided on a peripheral region of the substrate for supporting a lens substrate including a plurality of micro-lenses that are located to face the beams so that a convex portion of each of the micro-lenses is spaced from a top of each of the beams by the same distance as a focal distance of the micro-lenses. The supporting element may comprise a plurality of convex portions made of boron phosphate silicate glass or boron silicate glass. Alternatively, the supporting element may comprise a plurality of bearings provided on a packaging substrate and bonding agents surrounding the bearings, the packaging substrate being provided thereon with the sensor substrate.

BRIEF DESCRIPTIONS OF THE DRAWINGS

Preferred embodiments of the present invention will hereinafter be described in detail with reference to the accompanying drawings.

DESCRIPTIONS OF THE PREFERRED EMBODIMENTS

Figure 1A:
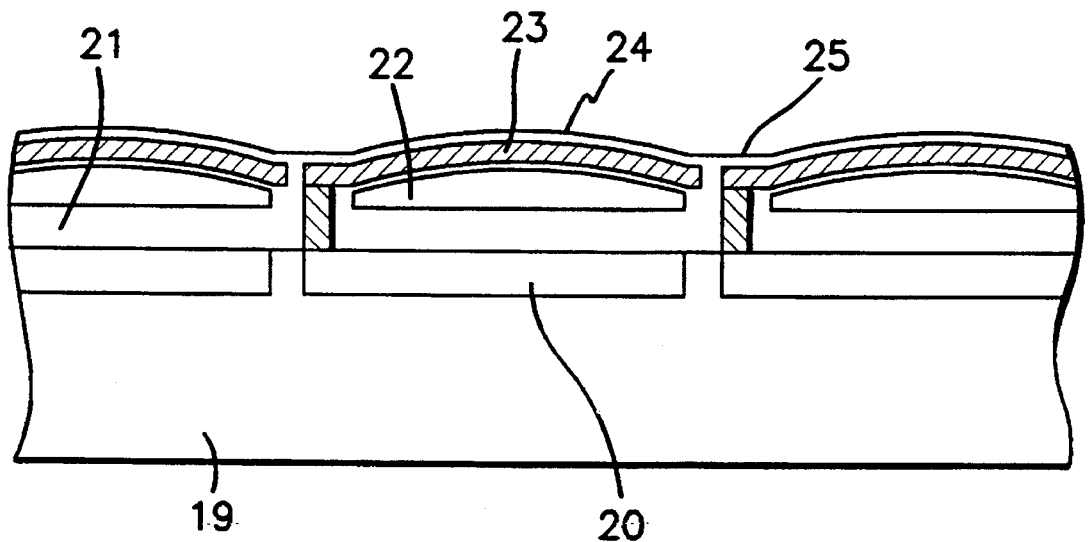
FIG. 1A is a cross sectional elevation view illustrative of a conventional infrared ray image pickup device of the first type.
Figure 1B:
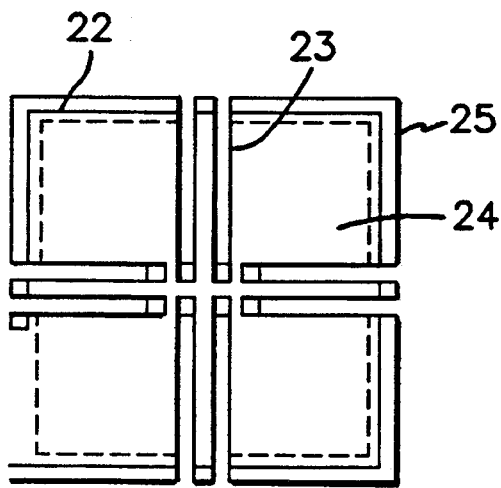
FIG. 1B is a plane view illustrative of the conventional infrared ray image pickup device of the first type of FIG. 1A.
Figure 2:
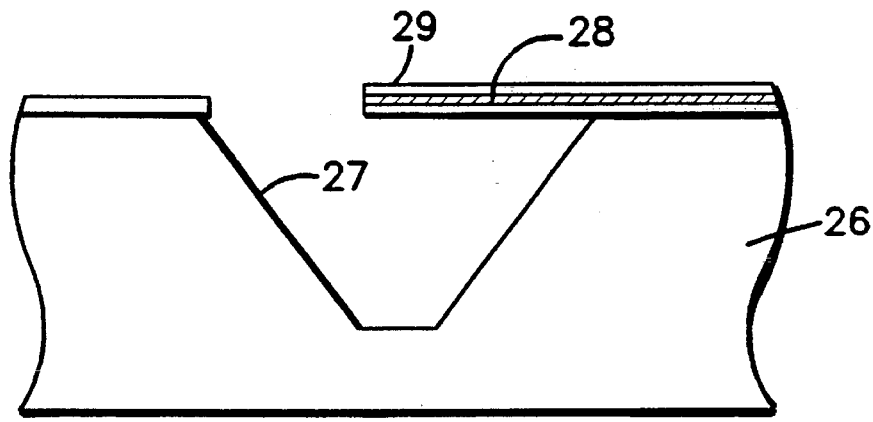
FIG. 2 is a cross sectional elevation view illustrative of a conventional infrared ray image pickup device of the second type.
Figure 3:
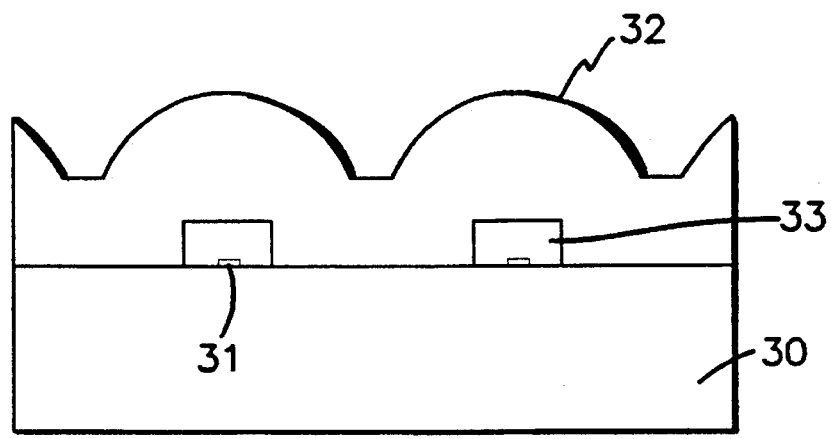
FIG. 3 is a cross sectional elevation view illustrative of a conventional infrared ray image pickup device of the third type.
Figure 5:
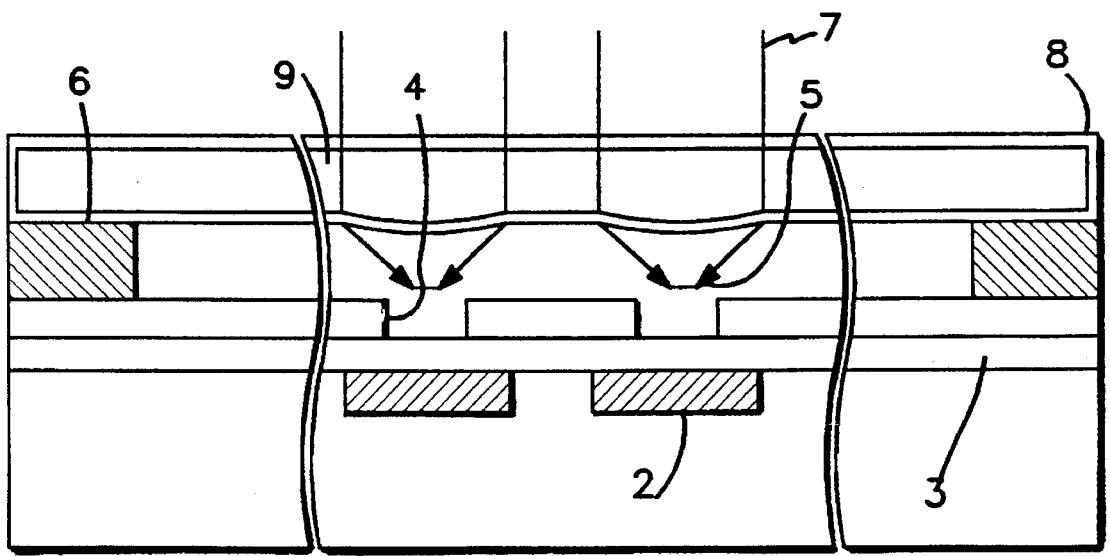
FIG. 5 is a cross sectional elevation view illustrative of a novel infrared ray image pickup device having a two dimensional array structure in a first embodiment according to the present invention.
Figure 4A:
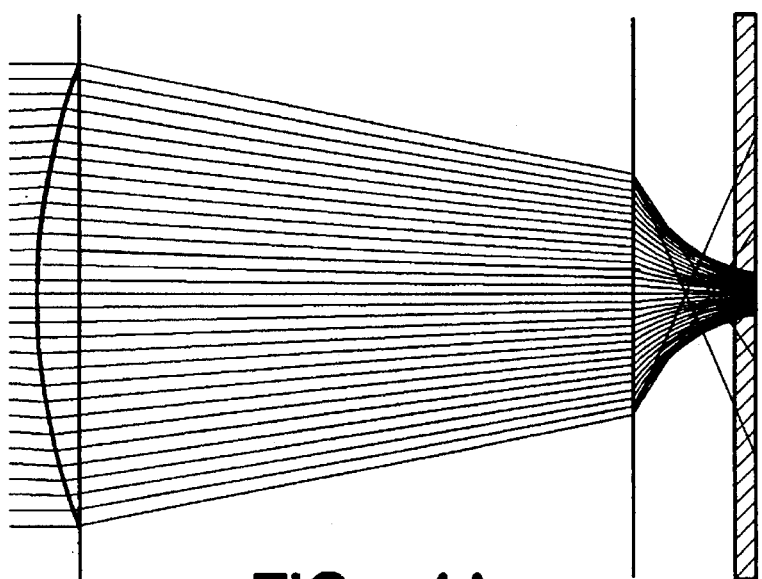
FIG. 4A is a view illustrative of a vertical incidence of infrared rays through a micro-lens involved in the conventional infrared ray image pickup device of the third type of FIG. 3.
Figure 4B:
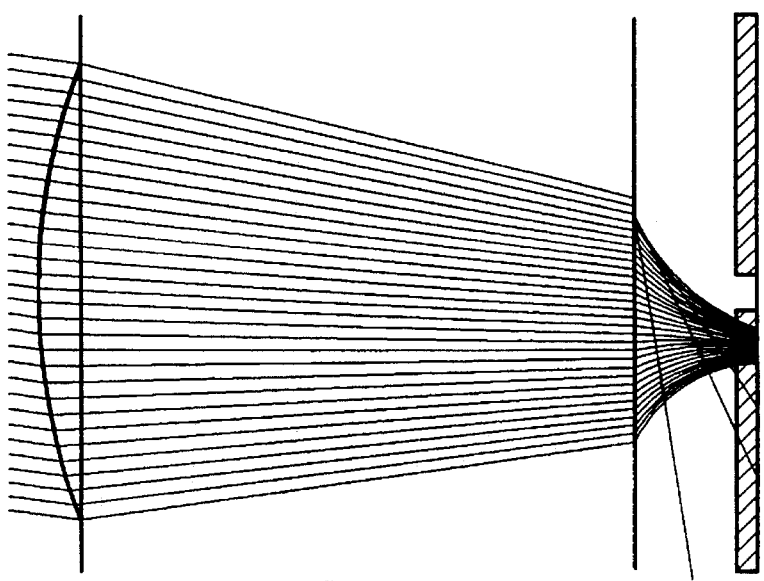
FIG. 4B is a view illustrative of an obstacle incidence of infrared rays through a micro-lens involved in the conventional infrared ray image pickup device of the third type of FIG. 3.
Figure 6:
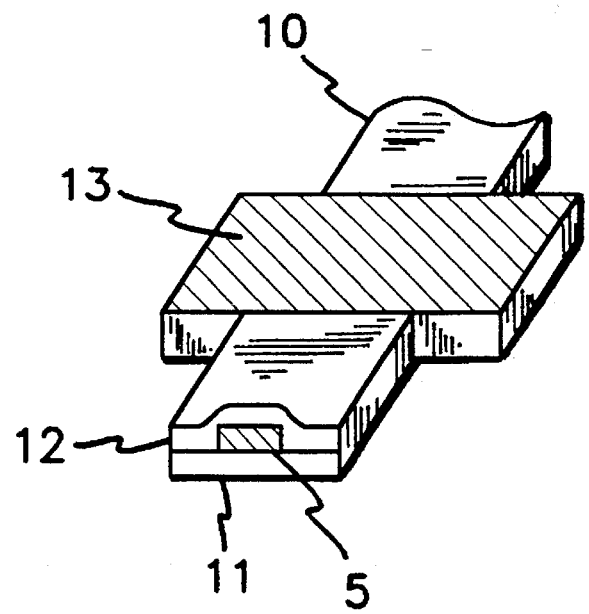
FIG. 6 is a fragmentary enlarged view illustrative of a beam involved in a novel infrared ray image pickup device having a two dimensional array structure in a first embodiment according to the present invention.
Figure 7:
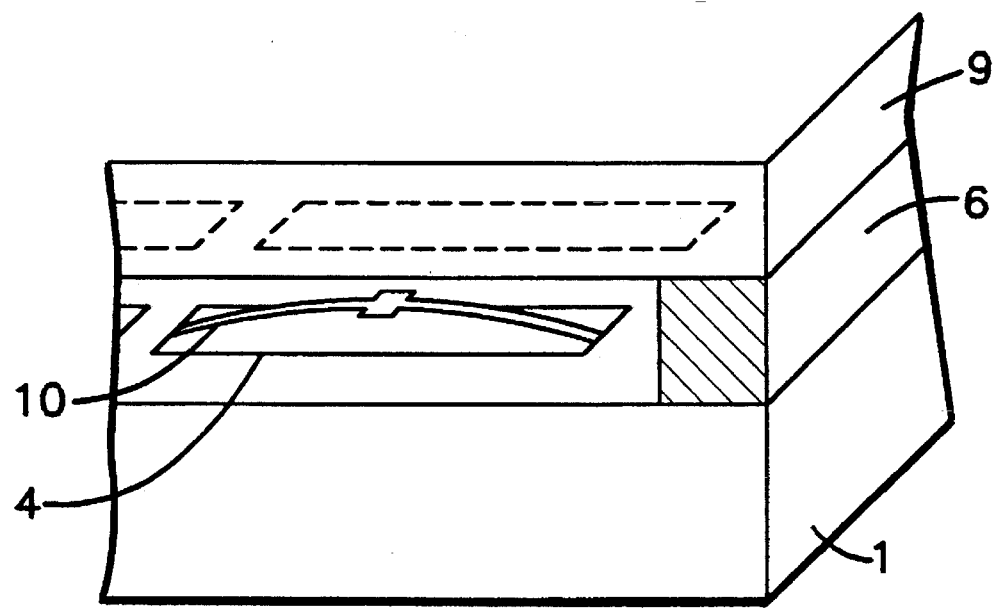
FIG. 7 is a fragmentary perspective view illustrative of a novel infrared ray image pickup device having a two dimensional array structure in a first embodiment according to the present invention.

A first embodiment according to the present invention will be described in detail with reference to FIGS. 5, 6 and 7 in which a novel infrared ray image pickup device having a two dimensional array structure is provided on a semiconductor substrate 1. Scanning circuits 2 are provided on a surface of the semiconductor substrate 1. Each of the scanning circuits 2 include a plurality of MOSFETs. A silicon oxide film 3 is provided on the semiconductor substrate 1 and the scanning circuits 2. A polysilicon film having cavities 4 is provided on the silicon oxide film 3 wherein each of the cavities 4 are positioned over the scanning circuits 2. The scanning circuits are arranged to form a two dimensional matrix array on the semiconductor substrate 1. Then, the cavities 4 are also arrange to form the two dimensional matrix array over the scanning circuits 2 through the silicon oxide film 3. Each of the cavities 4 has a rectangular shape that allows providing a beam 10 extending through the rectangular-shaped cavity in parallel to a longitudinal direction of the cavity. The beam 10 has a thickness of several hundred nanometers. The beam 10 extending through the cavity 4 along the longitudinal direction thereof comprises double layered beams comprising a silicon nitride film 11 and a silicon oxide film 12. A thermoelectric transducer 5 is provided along the beam 10 and sandwiched between the silicon nitride film 11 and the silicon oxide film 12. The beam 10 also has an infrared ray absorption layer 13 at a center portion thereof. The infrared ray absorption layer 13 is provided over the thermoelectric transducer 5 through the silicon oxide film 12 so that the thermoelectric transducer 5 may sense a temperature variation due to a heat generation by an infrared ray absorption into the infrared ray absorption layer 13. A micro-lens substrate including micro-lenses 9 is provided through convex portions 6 over the polysilicon film formed with the cavities 4 so that the convex portion 6 may permit the micro-lens substrate to be provided over and spaced part from the beams 10. The infrared ray absorption layers 13 included in the beams 10 extending through the cavities 4 are provided over the scanning circuits 2. The micro-lens 9 involved in the micro-lens substrate are located over the infrared ray absorption layers 13 so that the micro-lens 9 may converge the infrared ray 7 to the infrared ray absorption layer 13. An entire surface of the micro-lens substrate is coated with an anti-reflection film 8 for prevention of infrared ray reflection.

The cavities 4 may be formed by etching of the polysilicon film. The convex portion 6 may preferably be made of a boron phosphate silicate glass (BPSG) or a boron silicate glass (BSG) because either the boron phosphate silicate glass (BPSG) or the boron silicate glass (BSG) include ions and show a high fluidity in receipt of a heat treatment. Preferably, prior to the formation of the silicon oxide film serving as the convex portion 6 for spacing the beams 10 out the micro-lenses 9, a silicon nitride film having a thickness of approximately 0.1 micrometers is formed by a chemical vapor deposition method on the polysilicon film provided with the rectangular-shaped cavities 4 so that the BPSG film or the PGS film having a thickness of approximately 10 micrometers is formed by a chemical vapor deposition method over the silicon nitride film. The BPSG or BSG film may be grown at a high growth rate at a relatively low temperature. The BPSG or BSG film is then etched to form the convex portion 6 of silicon oxide wherein the silicon nitride film has a resistivity to etching for prevention of extra etching. The convex portions have a width of approximately 100 micrometers and are located inside of scribe lines peripheral to a pellet. The polysilicon film on which the beams 10 including the thermoelectric transducer 5 are formed are selectively etched to form the cavities 4 over which the beams 10 extend. The beams 10 have a gradual arched shape that is caused by a bimetal effect due to a difference in residual stresses between the silicon oxide film 12 and the silicon nitride film 11 constituting the beam 10. The silicon oxide film 12 has a residual stress for extension, while the silicon nitride film 11 has a residual stress for shortening. By the bimetal effect, the center portion at which the infrared ray absorption layer is provided in the beam is raised up to a higher level by approximately 1 micrometer than the opposite ends of the beam. Namely, the center portion of the beam 10 is positioned at a higher level by approximately 2 micrometers than a bottom of the cavity 4.

The micro-lense substrate may be formed as follows. A boron phosphate silicate glass film or a BPSG film is formed on a silicon substrate by a chemical vapor deposition for patterning thereof to form the micro-lens having a diameter of 50 micrometers and subsequent heat treatment thereof to form a lens spherical surface having a height of approximately 3 micrometers. The micro-lens is then subjected to an isotropic plasma etching for transcription of a lens definition to the silicon substrate. Silicon shows a permeability to the infrared rays and has a refractive index of approximately 4. The silicon substrate having lens patterns may serve as a micro-lens substrate having the micro-lenses. An entire surface or both top and bottom surfaces of the micro-lens substrate including the micro-lenses 9 is coated with the anti-reflection film 8 for prevention of the infrared ray reflection. The micro-lens substrate including the micro-lenses 9 may be bonded by an anodic bonding method on the semiconductor substrate 1 of the image pickup device. The micro-lens substrate is aligned on the semiconductor substrate 1 so that the micro-lenses 9 face to the beams 10 including the thermoelectric transducers 5. The bonding between the lens substrate and the semiconductor substrate 1 of the image pickup device is carried out by a heat treatment of a temperature of approximately 400° C. where a D.C. voltage of approximately 500V is further applied in which the lens substrate is set at a plus side of the D.C. voltage to cause a movement of boron atoms in the convex portion 6 to an interface thereof with the lens substrate to thereby form a space charge layer at the interface. The space charge layer may provide a large strength in bonding the lens substrate including the micro-lenses 9 with the convex portions united to the semiconductor substrate 1 of the image pickup device. As a result, the lens substrate including the micro-lenses 9 is securely bonded on the semiconductor substrate 1 so as to permit the micro-lenses 9 to converge the infrared rays onto the infrared ray absorption layer 13 provided on the center portion of the beam 10, namely to permit the infrared rays passing through to focus on the infrared ray absorption layer 13.

Figure 9:
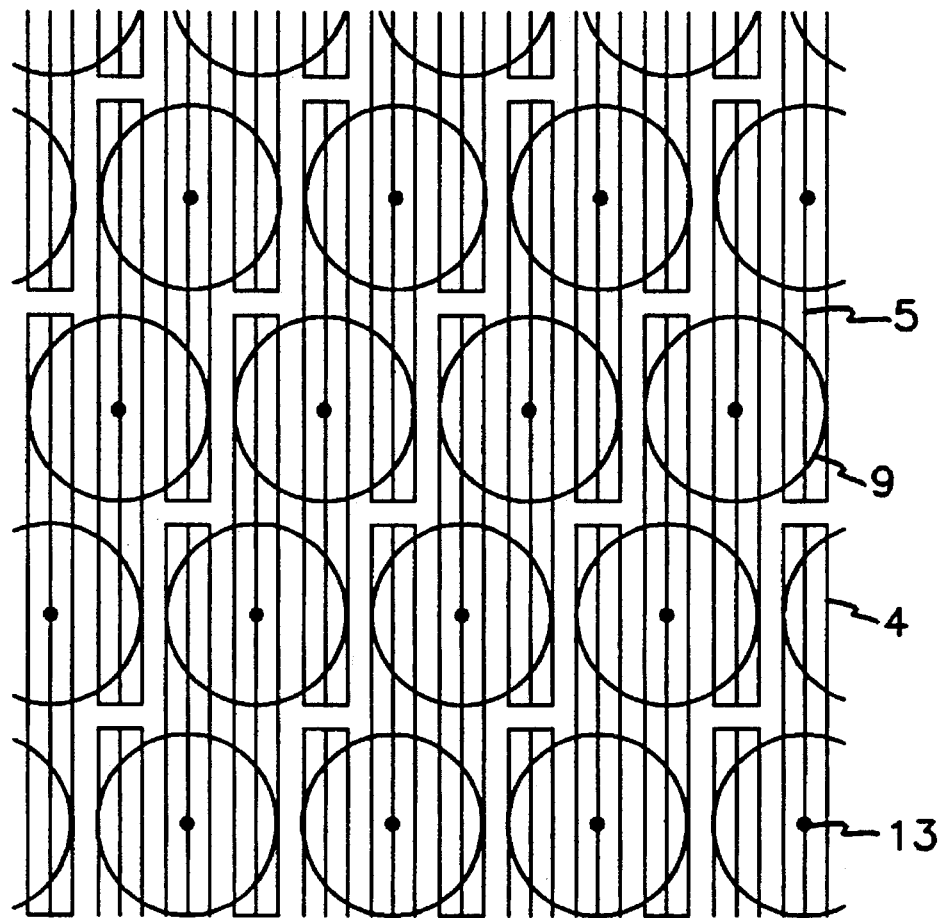
FIG. 9 is a plane view illustrative of a novel two-dimensional array infrared ray image pickup device according to the present invention.

FIG. 9 is the plane view of the novel infrared ray image pickup device according to the present invention. The micro-lenses 9 are arranged in matrix to form two dimensional arrays. Each of the micro-lenses 9 has a circular shape and is so located that a center of the circular micro-lens 9 corresponds to the infrared absorption layer 13 in the plane view. Each of the beams 10 may have sizes of 150 micrometers in a longitudinal side and 5 micrometers in a short side. A distance between the centers of any adjacent micro-lenses 9 is 50 micrometers. Namely, the micro-lenses 9 are provided at a pixel pitch of 50 micrometers. A large length of the beams 10 may prevent the heat conduction and may permit heat accumulation that causes an appreciable temperature variation for facilitating a sense thereof by the thermoelectric transducer 5.

The present invention in the first embodiment may provide an advantage in facilitating the secure bonding of the lens substrate including the micro-lenses 9 to the semiconductor substrate 1 of the image pickup device through a convex portion of the BPSG film or the BSG film. The convex portion provided on the semiconductor substrate 1 of the image pickup device may prevent the beams 10 having the thickness of several hundred nanometers from becoming broken by the contact with the lens substrate including the micro-lenses 9 in alignment of the micro-lenses 9. The convex portions are provided at peripheral regions to permit a high density integration of the two-dimensional arrays of the pixels. The novel structure of the infrared ray image pickup device may permit the convex lens surface to face the infrared ray absorption layer 13 overlying the thermoelectric transducer 5 that senses a temperature variation of absorptions of the infrared rays by the infrared ray absorption layer 13. The micro-lens 9 having the convex surface that faces the infrared ray absorption layer 13 may permit convergence of the infrared rays onto the infrared ray absorption layer 13, namely may permit the infrared rays to focus on the infrared ray absorption layer 13. The infrared ray passing through a peripheral portion of the micro-lens is irradiated on the infrared ray absorption layer 13. This permits the novel infrared ray image pickup device to have a high sensitivity.

Generally, the conventional infrared ray image pickup device having the two-dimensional arrays of pixels has been engaged with a problem in lowering signals due to reduction of the pixel size and also another problem in an increase of a noise by expansion of a noise band due to a reduction of a time for access to each pixel. An amount of the noise is proportional to a square root of the noise band. For example, under the conditions of 256×256 pixels and a frame frequency of 60 Hz, the conventional image pickup device has a wide noise band of 3.9 MHz that may allow a considerable large noise.

By contrast, the novel structure of the two-dimensional infrared ray image pickup device according to the present invention may provide a sufficient large area for providing integration circuits to the scanning circuits in each pixel for a considerable noise reduction. The noise band is reduced to 60 Hz and then an amount of the noise is reduced to 1/250 times. Further, the micro-lenses may allow the increase of the signal intensity thereby a high sensitive infrared ray image pickup device is obtained.

Figure 8:
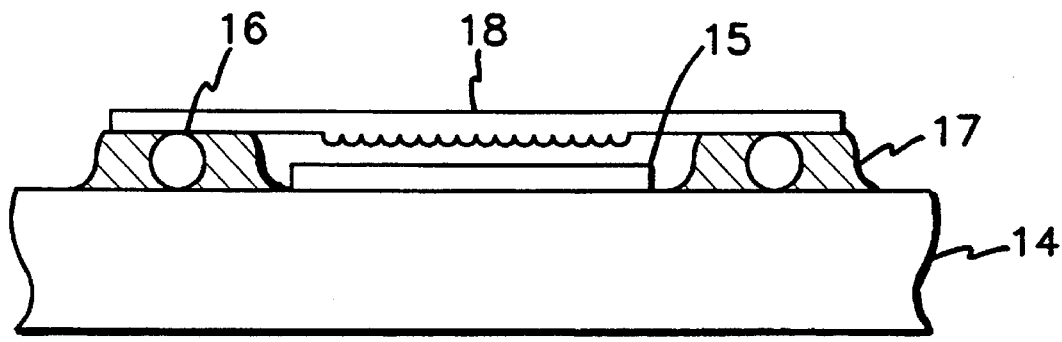
FIG. 8 is a cross sectional elevation view illustrative of a novel infrared ray image pickup device having a two dimensional array structure in a second embodiment according to the present invention.

A second embodiment according to the present invention will be described with reference back to FIG. 8 in which another novel infrared ray image pickup device is provided. In this embodiment, the beams 10 including the thermoelectric and the cavities 4 are provided on a sensor substrate 15 that is provided on a packaging substrate 14. The lens substrate including micro-lenses 18 are mounted through metal bearings 16 and bonding agents 17 surrounding the metal bearings 16 over the packaging substrate 14. The sensor substrate 15 has a thickness of approximately 600 micrometers. The beam 10 is arched so that a center portion thereof is positioned at a higher level by approximately 3 micrometers than opposite ends thereof. The micro-lenses 18 have a height of 5 micrometers. Focal distance is 20 micrometers. The bearing is designed to have the same diameter as a sum of the thickness of 600 micrometers of the sensor substrate 15, the raising level of 3 micrometers of the beam center portion, the micro-lens height of 5 micrometers and the focal distance of 20 micrometers.

The present invention in the second embodiment may also provide an advantage in facilitating the securely bonding of the lens substrate including the micro-lenses 18 to the packaging substrate 14 through the bearings 16 and the bonding agents 17. The bearings 16 provided on the packaging substrate 14 may prevent the beams 10 having the thickness of several hundred nanometers from becoming broken by the contact with the lens substrate including the micro-lenses 18 in alignment of the micro-lenses 18. The bearings 16 are provided on peripheral regions to permit a high density integration of the two-dimensional arrays of the pixels. The novel structure of the infrared ray image pickup device may permit the convex lens surface to face to the infrared ray absorption layer 13 overlying the thermoelectric transducer 5 that senses a temperature variation of absorptions of the infrared rays by the infrared ray absorption layer 13. The micro-lens 18 having the convex surface that faces to the infrared ray absorption layer 13 may permit convergence of the infrared rays onto the infrared ray absorption layer 13, namely may permit the infrared rays to focus on the infrared ray absorption layer 13. The infrared ray passing through a peripheral portion of the micro-lens is irradiated surely on the infrared ray absorption layer 13. This permits the novel infrared ray image pickup device to have a high sensitivity.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims any modifications of the present invention which fall within the sprit and scope of the invention.

What is claimed is:

1. An infrared ray image pickup device having a two-dimensional array structure comprises:

a substrate;

a plurality of scanning circuits provided as two-dimensional arrays on a surface of said substrate;

a layer having a plurality of cavities provided over said scanning circuits;

a plurality of beams extending across said cavities, each of said beams comprising:

a first plate-like beam portion made of a first insulation material, said first plate-like beam portion having a first width, and including an expanding portion having a second width larger than said first width;

a thermoelectric transducer provided on said first plate-like beam portion, said thermoelectric transducer extending along a longitudinal center axis of said first plate-like beam portion, and having a third width smaller than said first width;

a second plate-like beam portion having said first width and being provided to cover said thermoelectric transducer so that said thermoelectric transducer is completely sealed by said first and second plate-like beam portions, said second plate-like beam portion being made of a second insulation material having an inexpansive residual stress different from an expansive residual stress of said first insulation material of said first plate-like beam portion so that each of said beams is gradually arched to raise up its center portion, and said second plate-like beam portion including an expanding portion having the second width larger than said first width, said expanding portion of said second plate-like beam portion being positioned to correspond to said expanding portion of said first plate-like beam portion; and an infrared-ray absorption layer provided entirely on said expanding portion of said second plate-like beam portion;

a lens-substrate provided on a plurality of spacers provided on a peripheral area of said layer so that said lens-substrate is spaced apart from said layer, said lens-substrate having a plurality of micro-lenses whose centers are positioned directly over said expanding portions of said beams so that each of said micro-lenses faces said infrared-ray absorption layer, said spacers having a height equal to a sum of a difference in level between a top and bottom of said arched beams, a difference in level between the center and the edge of said micro-lenses and a focal distance of said micro-lenses thereby causing said micro-lenses to be spaced apart from the tops of said arched beams by said focal distance of said micro-lenses.

2. The infrared ray image pickup device as claimed in claim 1, wherein said spacers are made of a material selected from the group consisting of boron phosphate silicate glass and boron silicate glass.

3. The infrared ray image pickup device as claimed in claim 1, wherein said expanding portions of said first and second plate-like beam portions have a square-like shape.

4. The infrared ray image pickup device as claimed in claim 1, wherein said expanding portions of said first and second plate-like beam portions have a rectangular-like shape.

* * * * *